US007231563B2

(12) United States Patent
Vinke et al.

(10) Patent No.: US 7,231,563 B2
(45) Date of Patent: Jun. 12, 2007

(54) METHOD AND APPARATUS FOR HIGH SPEED TESTING OF LATCH BASED RANDOM ACCESS MEMORY

(75) Inventors: David Vinke, Clackamas, OR (US); Ekambaram Balaji, Portland, OR (US)

(73) Assignee: LSI Corporation, Milpitas, CA (US)

( * ) Notice: Subject to any disclaimer, the term of this patent is extended or adjusted under 35 U.S.C. 154(b) by 356 days.

(21) Appl. No.: 10/901,609

(22) Filed: Jul. 28, 2004

(65) Prior Publication Data

US 2005/0268185 A1   Dec. 1, 2005

Related U.S. Application Data

(60) Provisional application No. 60/574,810, filed on May 26, 2004.

(51) Int. Cl.
*G11C 29/00* (2006.01)
*G01R 31/28* (2006.01)
(52) U.S. Cl. .................... 714/718; 714/730; 714/731
(58) Field of Classification Search .............. None
See application file for complete search history.

(56) References Cited

U.S. PATENT DOCUMENTS 5,394,403 A * 2/1995 Klein .................... 714/718
5,761,489 A * 6/1998 Broseghini et al. ......... 712/227
5,878,055 A * 3/1999 Allen ....................... 714/744
6,097,664 A * 8/2000 Nguyen et al. ........ 365/230.05
6,574,762 B1 * 6/2003 Karimi et al. ............. 714/727
2004/0148554 A1 * 7/2004 Dervisoglu et al. ......... 714/727

OTHER PUBLICATIONS

Vida-Toku et al., "Designing for Scan Test of High Performance Embedded Memories", Aug. 1998, IEEE, pp. 101-108.*
Zarrineh et al., "Automatic Insertion of Scan Structure to Enhance Testability of Embedded Memories, Cores and Chips", Apr. 26-30, 1998, Proceeding of the 16th IEEE VLSI Test Symposium, pp. 98-103.*

* cited by examiner

*Primary Examiner*—Alber Decady
*Assistant Examiner*—John J. Tabone, Jr.
(74) *Attorney, Agent, or Firm*—Westman, Champlin & Kelly

(57) ABSTRACT

A method and apparatus for testing latch based random access memory includes steps of generating a scan enable signal for testing latch based random access memory and generating a scan clock signal for testing the latch based random access memory wherein the scan clock signal has a first scan clock period for a shift cycle and a second scan clock period for a capture cycle.

16 Claims, 9 Drawing Sheets

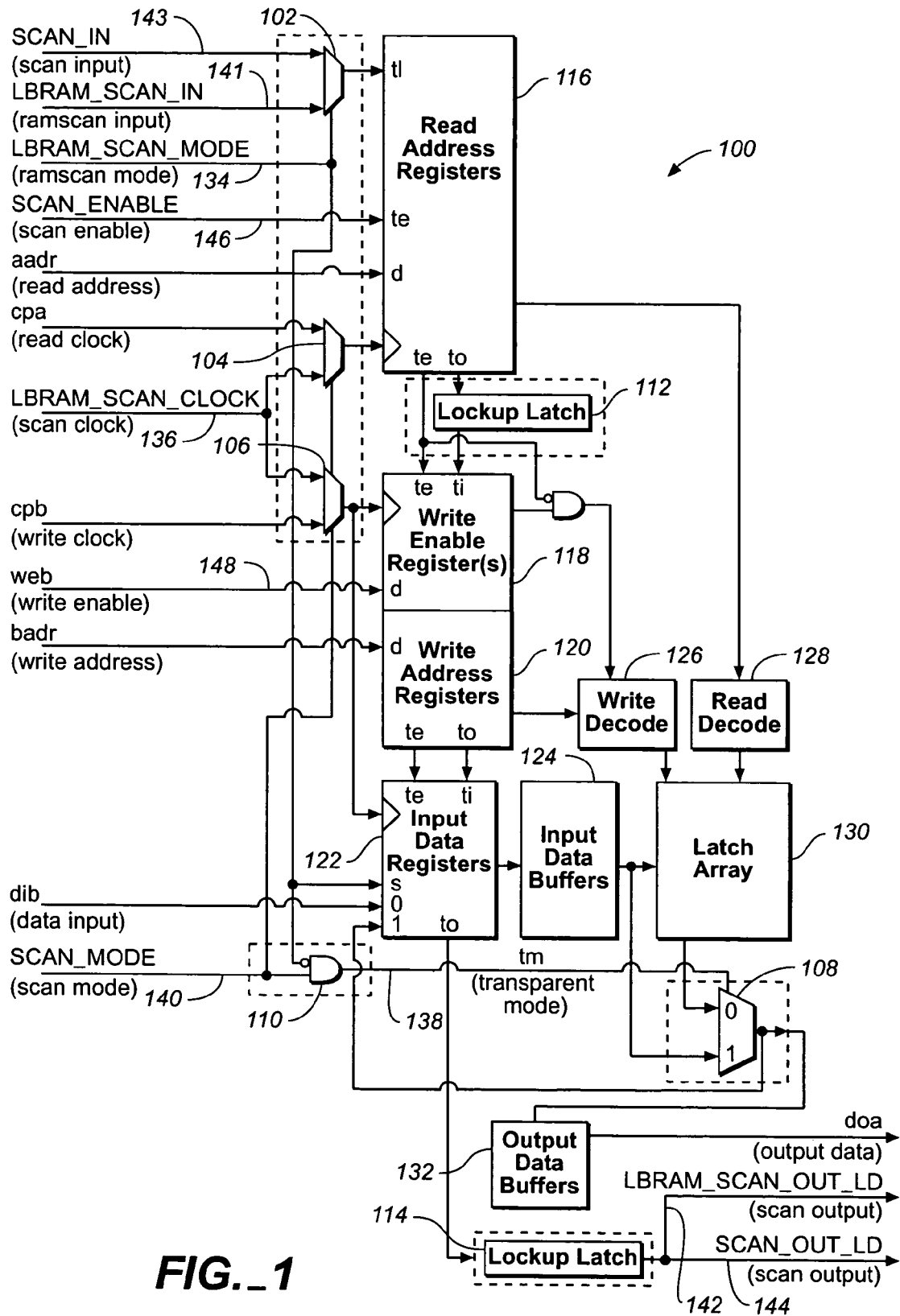
FIG._1

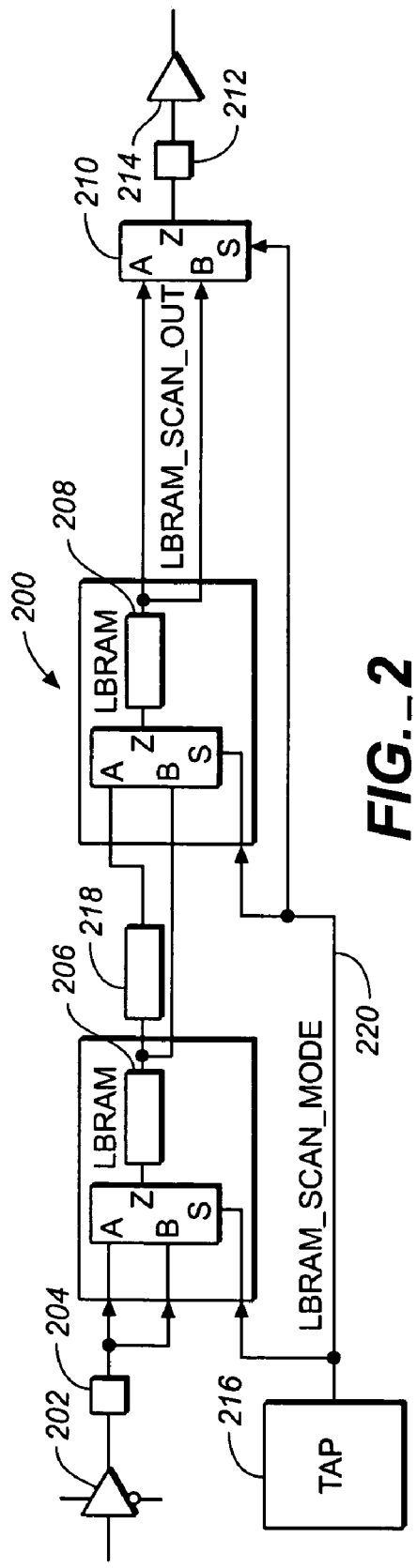
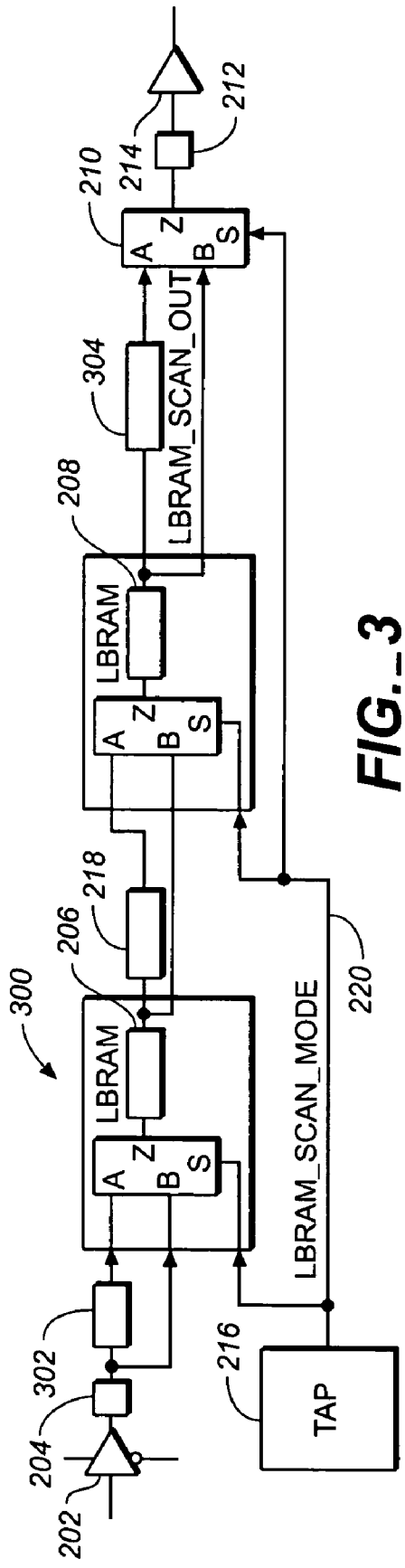
*FIG._2*
*FIG._3*

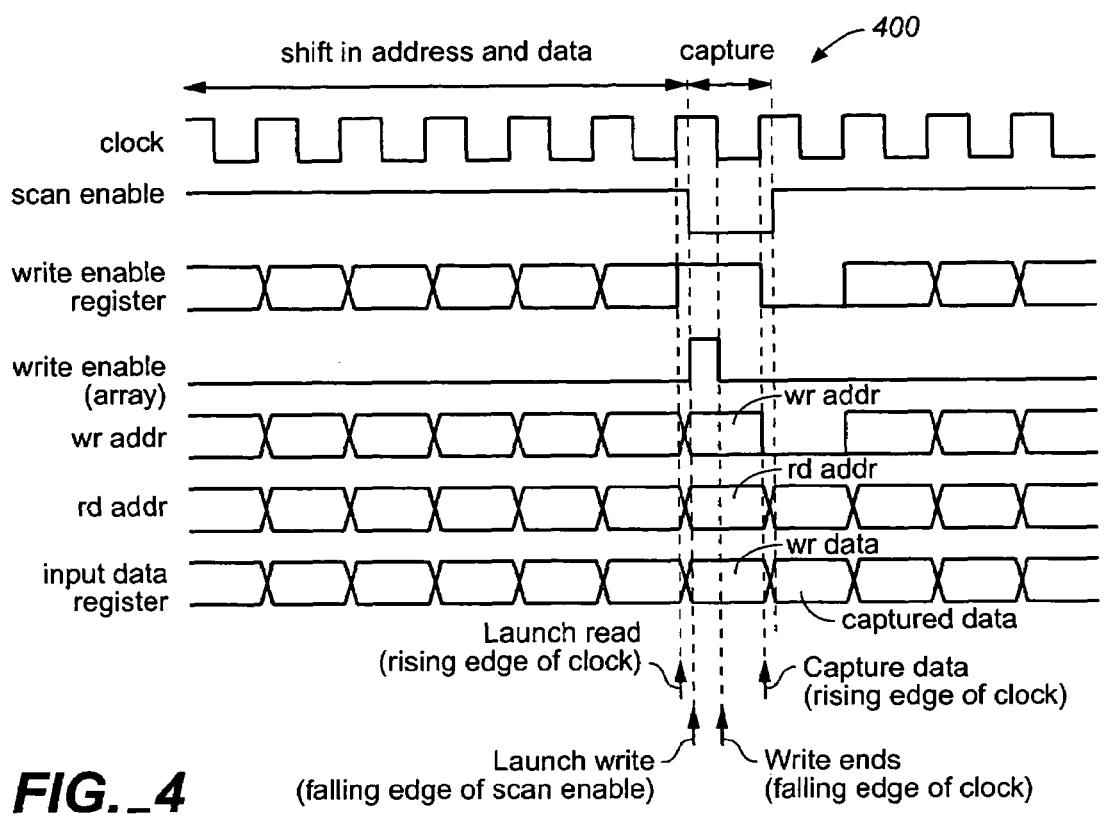
FIG._4
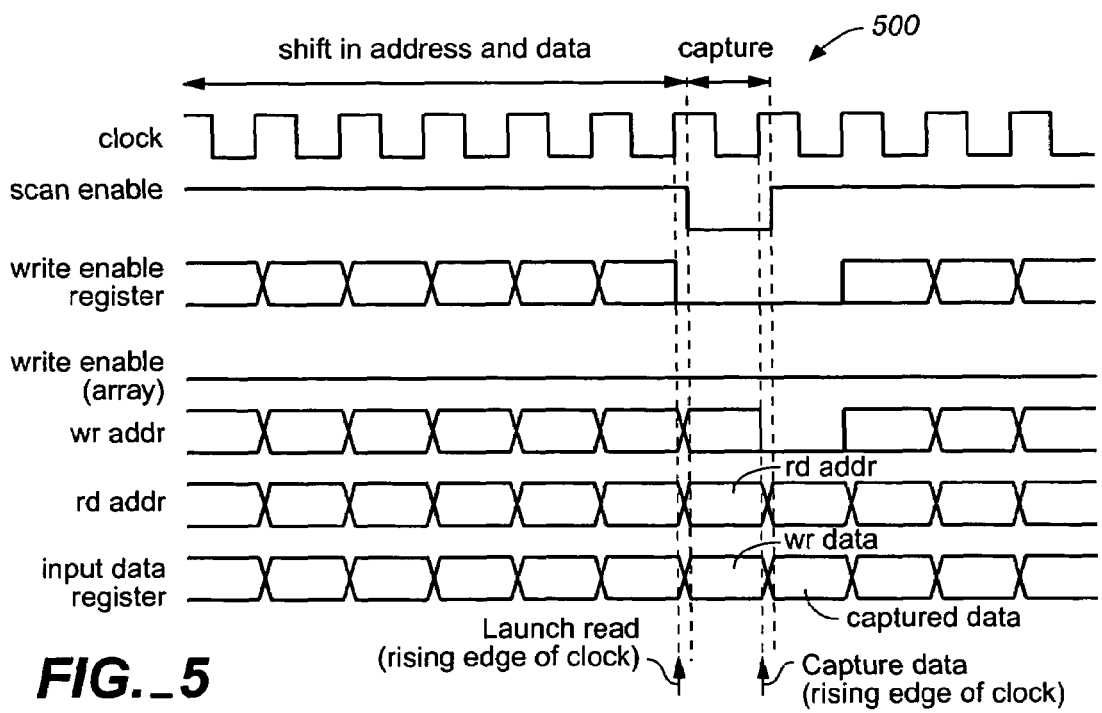
FIG._5

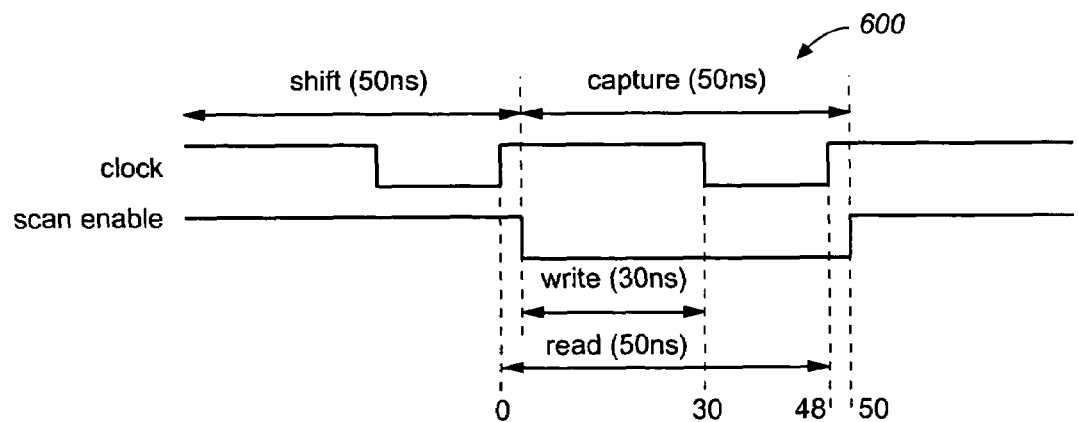
FIG._6
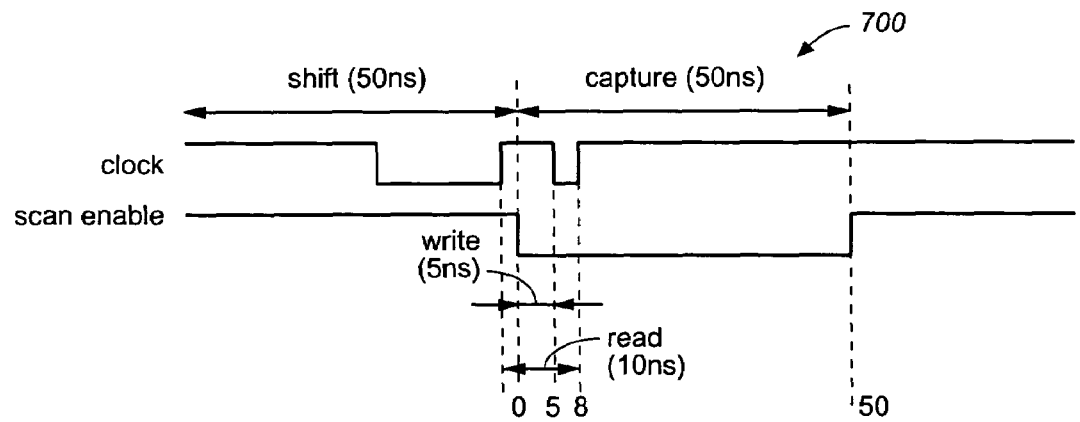
FIG._7

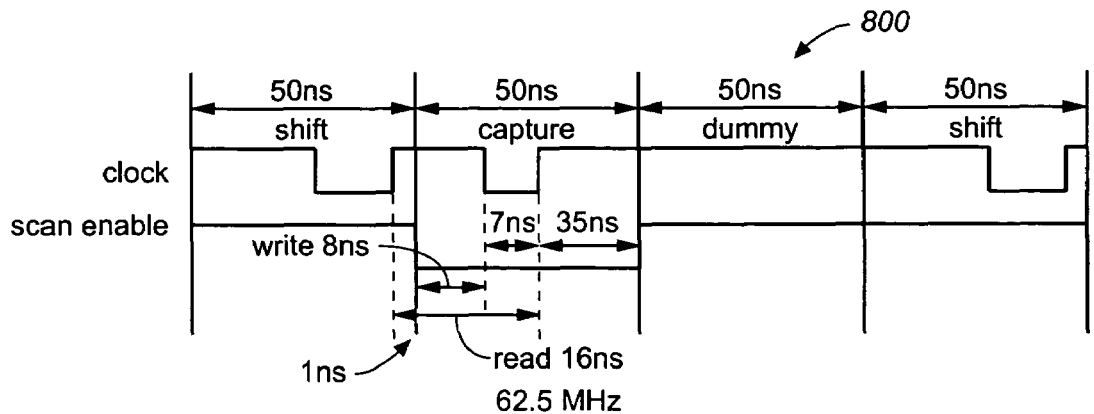
FIG._8
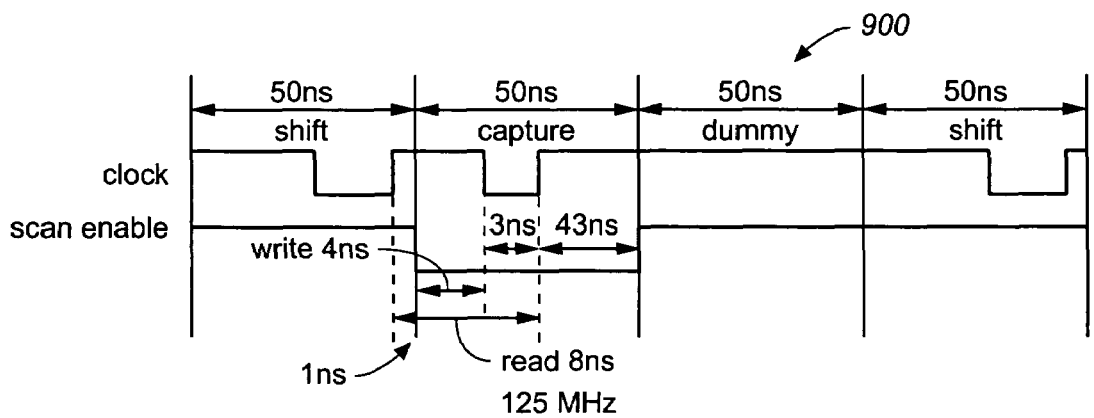
FIG._9
| Name | Time [ps] |
|---|---|
| Tester skew | +/- 150 |
| Tester ramptime uncertainty | +/- 150 |
| Loadboard skew | +/- 25 |
| Scan clock/enable insertion delay uncertainty | +/- 100 |
| Scan clock uncertainty | +/- 250 |
| Total | +/- 675 |
FIG._12

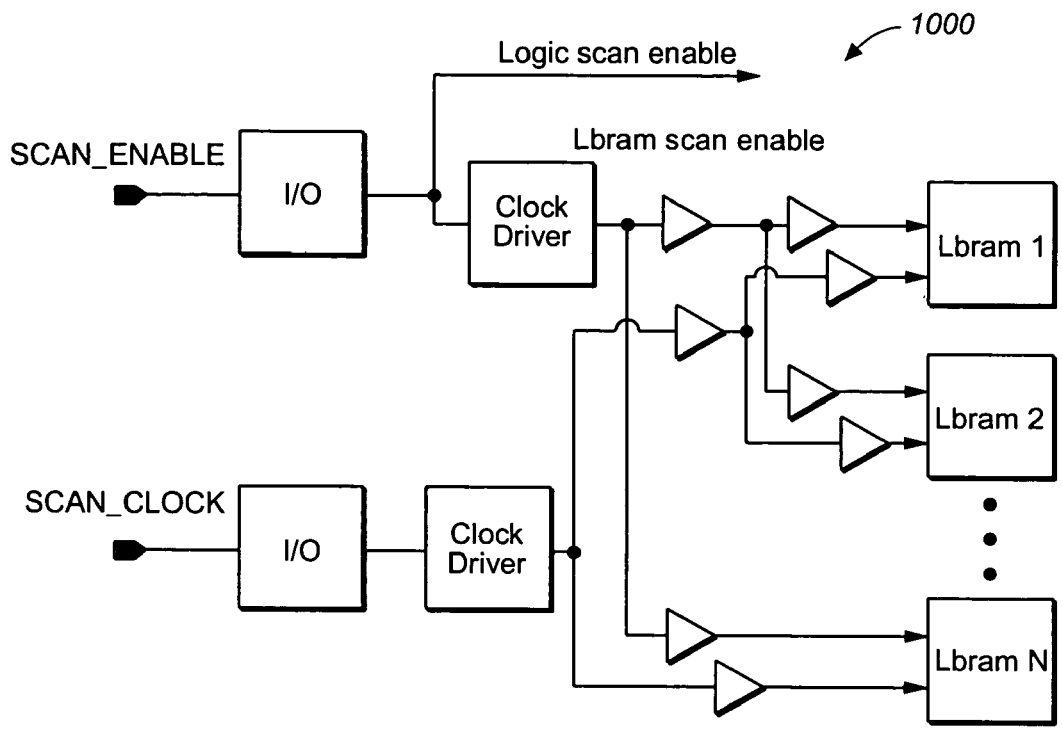
FIG._10
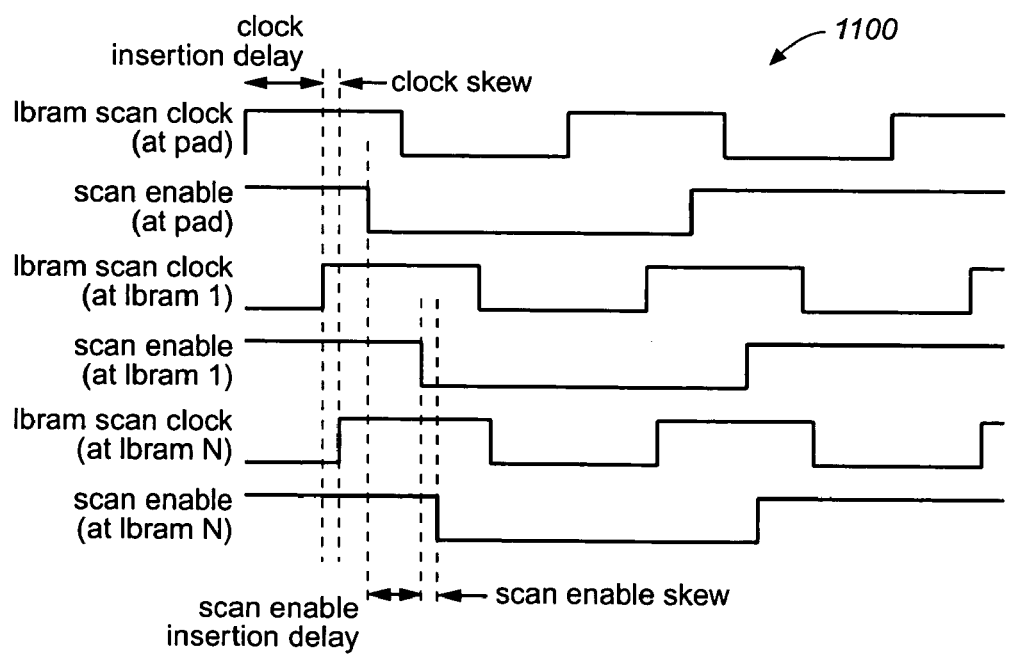
FIG._11

FIG. 13

```
Step 1:
for i = 0, i < r, i++                              ← 1300
        if (i is even)
                Wi(AAAA)
        else
                Wi(5555)
        end
end Step 2:
R0(AAAA)
for i = 1, i < r, i++
        if (i is even)
                Ri(AAAA)
                Wi-1(AAAA)
        else
                Ri(5555)
                Wi-1(5555)
        end
end
if (r is even)
        Wr-1(AAAA)
else
        Wr-1(5555)
end Step 3:
if (r is even)
        Rr-1(AAAA)
else
        Rr-1(5555)
end
for i = r-1, i > 0, i--
        if (i is even)
                Ri-1(AAAA)
                Wi(0000)
        else
                Ri-1(5555)
                Wi(FFFF)
        end
end
W0(0000)

Step 4:
DIB0 = FFFF
for i = 1, i < r, i++
        if (i is even)
                DIBi = FFFF            Step 5:
                Ri-1(FFFF)             for i = 0, i < r, i++
        else                                   if (i is even)
                DIBi = 0000                            Ri(FFFF)
                Ri-1(0000)                             Wi(FFFF)
        end                                    else
end                                                    Ri(0000)
if (r is even)                                         Wi(0000)
        Rr-1(FFFF)                             end
else                                   end
        Rr-1(0000)
end
```

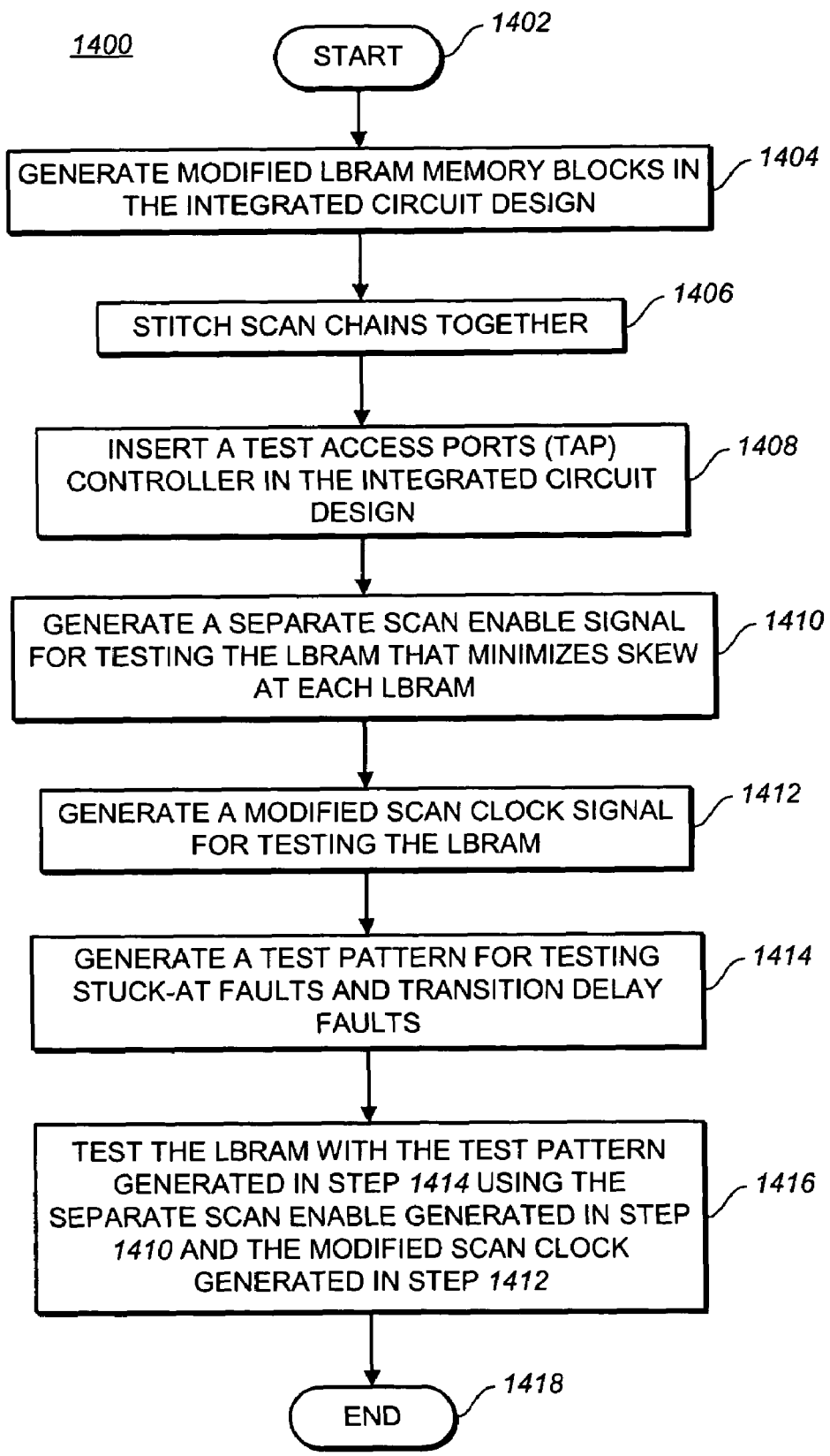
FIG._14

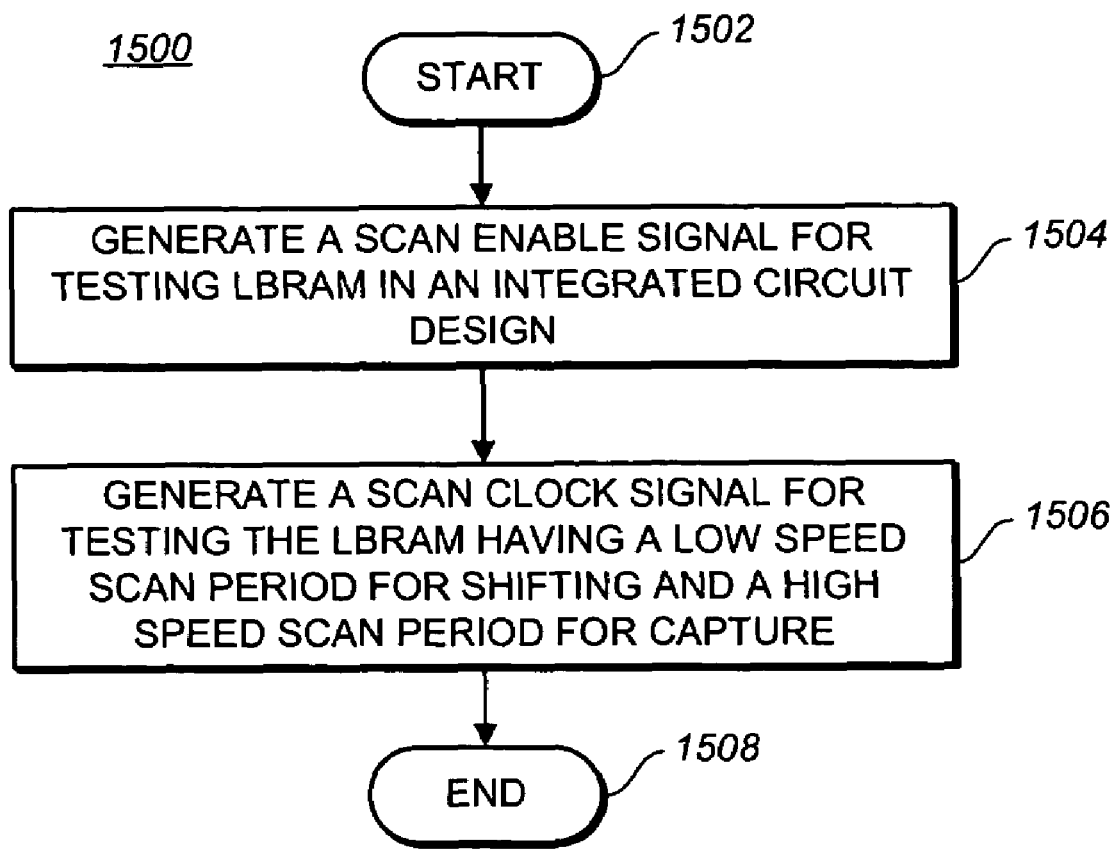
FIG._15

METHOD AND APPARATUS FOR HIGH SPEED TESTING OF LATCH BASED RANDOM ACCESS MEMORY

CROSS REFERENCE TO RELATED APPLICATIONS

This application for patent claims the benefit of U.S. Provisional application No. 60/574,810, filed on May 26, 2004, for METHOD AND CIRCUIT FOR SCAN TESTING LATCH BASED RANDOM ACCESS MEMORY, incorporated herein by reference.

BACKGROUND OF THE INVENTION

1. Field of the Invention

The present invention relates generally to the design and testing of memory arrays for integrated circuits. More specifically, but without limitation thereto, the present invention relates to the design and testing of latch based random access memory (LBRAM) in an application-specific integrated circuit (ASIC).

2. Description of Related Art

The use of memory arrays in application-specific integrated circuits (ASICs) is increasing, and it is estimated that memory arrays will constitute 94 percent of the die area in the average application-specific integrated circuit by the year 2014. There is also an increase in the use of small memories, typically implemented as latch based random access memory (LBRAM). A typical application-specific integrated circuit design uses over 400 latch based random access memory arrays. A key issue with the use of such a large number of memory arrays is how to test the memory arrays for manufacturing defects without increasing the die area by an excessive amount.

Application-specific integrated circuits (ASICs) are susceptible to manufacturing defects that may cause the ASIC to malfunction, called faults. Two important categories of faults are stuck-at faults (SAF) and transition delay faults (TDF). Stuck-at faults occur when a signal inside the ASIC that was designed to transition between two logic states (0 and 1) remains in one state due to a chip defect. A transition delay fault occurs when a signal transitions too late for proper operation due to, for example, excessive net capacitance.

To determine whether an ASIC has faults, the ASIC is typically tested using automated test equipment (ATE) to detect and reject defective parts before shipment to a customer. The number of faults that may be detected by ATE using a test devised by the manufacturer is typically expressed as a percentage of the total number of possible faults and is called the fault coverage of the test. A high value of fault coverage is desirable to avoid the costs associated with delivering defective parts.

SUMMARY OF THE INVENTION

In one aspect of the present invention, a method of testing latch based random access memory includes method includes steps of:

generating a scan enable signal for testing latch based random access memory; and
generating a scan clock signal for testing the latch based random access memory wherein the scan clock signal has a first scan clock period for a shift cycle and a second scan clock period for a capture cycle.

Other embodiments further include a step of substantially minimizing skew of the scan enable signal relative to each one of the latch based random access memory and a step of providing a clock tree to minimize skew of the scan enable signal relative to each one of the latch based random access memory. In additional embodiments, the scan clock signal has a falling edge in the capture cycle wherein the falling edge occurs about one-half the second scan clock period from the previous rising edge, the scan clock signal has a rising edge in the capture cycle wherein the rising edge occurs about one full second scan clock period from the previous rising edge minus about two nanoseconds, insertion delay of the scan enable signal differs from that of the scan clock signal by less than 250 picoseconds at each one of the latch based random access memory, the first scan clock period corresponds to a frequency of about 20 MHZ, and the second scan clock period corresponds to a frequency of about 62 MHz, 100 MHz, or 125 MHz.

In another aspect of the present invention, an apparatus for testing latch based random access memory includes:

scan chains for testing latch based random access memory wherein the scan chains are implemented in existing registers inside the latch based random access memory;

a scan enable signal generator for generating a scan enable signal to test the latch based random access memory; and a scan clock signal generator for generating a scan clock signal to test the latch based random access memory wherein the scan clock signal has a first scan clock period for a shift cycle and a second scan clock period for a capture cycle.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates a modified LBRAM according to an embodiment of the present invention;

FIG. 2 illustrates a schematic of a scan chain with a logic chain external to the modified LBRAM of FIG.

FIG. 3 illustrates a schematic of a scan chain with multiple logic scan chains external to the modified LBRAM of FIG. 1;

FIG. 4 illustrates a timing diagram of a write and read operation for a memory array using the LBRAM of FIG. 1;

FIG. 5 illustrates a timing diagram of a read operation for a memory array using the LBRAM of FIG. 1;

FIG. 6 illustrates a detailed timing diagram of the clock and scan enable signals of FIGS. 4 and 5 for shifting at a clock speed of 20 MHZ;

FIG. 7 illustrates a detailed timing diagram of an accelerated clock signal for high speed testing according to an embodiment of the present invention;

FIG. 8 illustrates a capture timing diagram for 62.5 MHz according to an embodiment of the present invention;

FIG. 9 illustrates a capture timing diagram for 125 MHz according to an embodiment of the present invention;

FIG. 10 illustrates a schematic diagram for a scan enable signal according to an embodiment of the present invention;

FIG. 11 illustrates a diagram of insertion delay and skew of the scan clock and the scan enable signals for the schematic of FIG. 10;

FIG. 12 illustrates a table of insertion delay and skew in a timing setup for a scan tester according to an embodiment of the present invention;

FIG. 13 illustrates an example of a march algorithm used to generate a test pattern for the LBRAM of FIG. 1;

FIG. 14 illustrates a flow chart of a method of high speed testing of latch based random access memory according to an embodiment of the present invention; and FIG. 15 illustrates a flow chart summarizing the method of FIG. 14.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

To facilitate testing of ASICs using automated test equipment (ATE), test logic is generally included in the ASIC circuit itself. The test logic usually functions only during testing and has no utility during normal operation of the ASIC in the field. Nevertheless, the test logic consumes additional die area in the ASIC, which results in fewer die manufactured on each wafer. The reduced wafer yield results in increased production costs. The automated test equipment is also expensive, consequently the testing time required for each ASIC further increases production costs.

As the use of latch based memory arrays in ASICS increases, there is an increased probability that faults will occur, necessitating more test logic. However, the added test logic for the memory arrays further increases the die area, disadvantageously reducing the wafer yield. Also, the additional testing required for more memory arrays increases the test time. To maintain high fault coverage without excessively increasing costs, it is desirable to minimize the amount of test logic and the time required for test. A number of methods currently exist for testing latch based memory arrays.

In the built-in self-test (BIST) method, special test logic circuits are included in the ASIC design. The BIST logic generates a set of test patterns to test the memory, writes the test patterns into the memory, reads the memory, and compares the memory outputs with the test patterns to detect faulty memory locations. Most of the testing is controlled by the BIST logic, and the automated test equipment (ATE) simply signals the BIST to start the test and then reads the fault information generated by the BIST. BIST may be used for high speed testing of LBRAM, however, BIST adds far too much die area compared to the size of LBRAM, as much as 100 percent for small configurations. The resulting die size can become so large that the ASIC is no longer cost effective to manufacture.

In the scan method, all the flip-flop elements in the ASIC design are connected in large scan chains. During scan test, test patterns are shifted through the scan chains to initialize the flip-flop elements to a predetermined state. The output data from the logic elements connected to the flip-flop elements is captured by other flip-flop elements that are also part of the scan chains. The captured data is then shifted out. The ATE controls the shifting and capture phases and transmits the test patterns to the ASIC. The same clock signal is used during the shift and capture phases, and a scan enable signal is used to control when shifting occurs and when data is captured. The ATE also receives the captured data when it is shifted out and compares the captured data to expected results. This method of testing is called launch off shift because the logic under test begins to transition to the state that is captured immediately after the final shift. Launch off shift is not normally used for high speed testing because the scan enable signal design typically results in slow ramptimes without taking into consideration propagation delay of the scan enable signal through the ASIC.

In the launch off capture method, the capture phase is extended by a second clock pulse. During the shift phase, a test pattern is scanned into upstream flip-flops that drive control flip-flops that drive the logic under test (LUT). The first capture clock pulse is used to load the test output values from the control flip-flops into the logic under test (LUT). The second capture clock pulse is used to load the test output values from the logic under test into observation flip-flops. The upstream flip-flops for group of logic under test may and likely will also be control or observation flip-flops for another group of logic under test. This method is called launch off capture because the logic under test begins to transition to the final capture state immediately after the first clock pulse of the capture phase. The timing between the first and second capture clock pulses determines the speed of the test, therefore the speed of the test does not depend on the timing of the scan test signal.

Software tools such as Fastscan from Mentor Graphics are commercially available to automatically calculate the test patterns that are shifted into the upstream logic to achieve a selected state of the control flip-flops after the initial capture clock pulse. However, depending on the upstream logic, it may not be possible to achieve all possible combinations of logic states for the control flip-flops, which limits the fault coverage for transition delay faults.

Scan testing may be used with latch based memory arrays by including scannable latches in the memory arrays and including the scannable latches in scan chains. Test patterns may then be scanned into the memory arrays in the same manner as for other flip-flop elements in the ASIC design. This method provides high fault coverage, however, using scannable latches inside the LBRAM significantly increases the die area of each LBRAM, because scannable latches require more logic gates than non-scannable latches.

For some ASIC designs, the total number of flip-flop elements, or latches, used in a large number of small LBRAM arrays may be in the millions. Because each latch is included in the scan chains, the scan chains may be extremely long. Because each test pattern must be serially scanned through the scan chains, long scan chains imply correspondingly high testing times required to test the LBRAM arrays. The testing time may be so large that the ASIC is no longer cost effective to manufacture.

In the scan collar method, flip-flops in the scan chains apply input data to the latch based memory and monitor the data output from the latch based memory. This avoids having to include latches in the scan chains. Previous LBRAM designs do not include flip-flops for scanning test patterns, however, flip-flops may be added around the LBRAM to control the LBRAM inputs and read the LBRAM outputs. These added flip-flops are called a scan collar.

During scan test, test patterns for the logic portion of the ASIC design, that is, the portion that does not include the latch based memory arrays, are typically generated randomly by a process called automatic test pattern generation (ATPG). The test patterns provided by automatic test pattern generation do not provide high fault coverage for latch based memory arrays. However, test pattern generators for small memory arrays are available, for example, MacroTest from Mentor Graphics, that generate deterministic test vectors. A scan test collar may be added to each LBRAM and driven by such a test pattern generator to provide excellent fault coverage. The scan test collar also increases the die area overhead and the production cost of the ASIC, although not as severely as the BIST method. Furthermore, most of the flip-flops in the ASIC design are included in the scan chains, even during the LBRAM test, resulting in long scan test chains and testing time.

MacroTest also has the capability to trace through logic connected to small memory arrays to find flip-flops that may be used to write to the memory inputs and read from the memory outputs. This capability requires no scan collar or other additions or changes to the internal structure of the LBRAM, however, the trace through the ASIC design to find flip-flops that may be used to write to the LBRAM inputs and read from the LBRAM outputs is not always successful, especially in ASIC designs using multiple LBRAM arrays. In these instances, the ASIC manufacturer must accept reduced fault coverage or rework the design to add scannable flip-flops. The former implies higher failure rates, while the latter creates undesirable complexity to the design flow. Also, most of the flip-flops in the ASIC design must be included in the scan chains, resulting in long testing times to test LBRAM arrays.

A preferred method of scan testing uses specially designed LBRAM having specific scan enhancements. The scan enhancements include using the existing flip-flops in the LBRAM to control loading of input data into the latches and also to capture the output data from the latches. A separate LBRAM test block is created to test the internal functionality of the LBRAM. During the LBRAM test, the LBRAM flip-flops are included in the scan chains that are used only during LBRAM scan test. The length of the LBRAM scan chains is significantly smaller than the scan chains used to test the ASIC logic, advantageously reducing tester time. The LBRAM flip-flops are also included in the normal logic scan chains during logic scan test so that the logic connected to the LBRAM inputs and outputs may be tested. This method advantageously adds very little tester time and very little area for the extra required test logic. However, because the LBRAM scan chains only include the LBRAM flip-flops, then the upstream flip-flops needed for the launch off capture method are likely not included in the LBRAM scan chains. Consequently, the launch off capture method may not be used for high speed testing with this method.

In one aspect of the present invention, a method of testing latch based random access memory includes method comprising steps of:
  generating a scan enable signal for testing latch based random access memory; and
  generating a scan clock signal for testing the latch based random access memory wherein the scan clock signal has a first scan clock period for a shift cycle and a second scan clock period for a capture cycle.

In another aspect of the present invention, an apparatus includes:
  scan chains for testing latch based random access memory wherein the scan chains are implemented in existing registers inside the latch based random access memory;
  a scan enable signal generator for generating a scan enable signal to test the latch based random access memory; and
  a scan clock signal generator for generating a scan clock signal to test the latch based random access memory wherein the scan clock signal has a first scan clock period for a shift cycle and a second scan clock period for a capture cycle.

FIG. 1 illustrates a modified LBRAM 100 according to an embodiment of the present invention. Shown in FIG. 1 are a scan input multiplexer 102, clock multiplexers 104 and 106, a latch array bypass multiplexer 108, bypass logic 110, lock-up latches 112 and 114, a read address register 116, a write enable register 118, a write address register 120, an input data register 122, an input data buffer 124, a write address decoder 126, a read address decoder 128, a latch array 130, an output data buffer 132, a memory scan mode signal 134, a LBRAM scan clock signal 136, a bypass logic signal 138, a scan mode signal 140, an LBRAM test scan chain input 141, an LBRAM scan output signal 142, a logic test scan chain input 143, a logic scan output signal 144, a scan enable signal 146, and a write enable 148.

In FIG. 1, the modified latch based RAM 100 includes the scan input multiplexer 102, the clock multiplexers 104 and 106, the latch array bypass multiplexer 108, the bypass logic 110, and the lock-up latches 112 and 114, which are enclosed by dashed lines to distinguish these components from the standard, well-known components of an LBRAM. The standard components of an LBRAM are the read address register 116, the write enable register 118, the write address register 120, the input data register 122, the input data buffer 124, the write address decoder 126, the read address decoder 128, the latch array 130, and the output data buffers 132.

The scan input multiplexer 102 connects the test input of the read address register 116 to the LBRAM test scan chain 141 or to the logic test scan chain 143 in response to the memory scan mode signal 134. The memory scan mode signal 134 is typically generated by an on-chip test module called a test access port (TAP) module according to well-known techniques.

The clock multiplexers 104 and 106 connect the read clock and the write clock inputs respectively of the modified latch based RAM 100 to either the read and write clocks generated by the application or to the LBRAM scan clock signal 136 in response to the scan mode signal 140. The clock multiplexers 104 and 106 allow all the flip-flops in the LBRAM test scan chain to be controlled by the LBRAM scan clock signal 136 during scan testing.

The latch array bypass multiplexer 108 allows the LBRAM data output buffer 132 to be connected to either the latch array 130 during application-specific operation, that is, the design function of the integrated circuit die, or directly to the input data register 122 in response to the bypass logic signal 138, thereby bypassing the latch array 130 during logic scan testing.

The bypass logic 110 generates the bypass logic signal 138 in response to the LBRAM scan mode signal 134 and the scan mode signal 140. The bypass logic signal 138 controls the latch array bypass multiplexer 108 during application-specific operation, LBRAM scan test, and logic scan test. The LBRAM scan mode signal 134 is typically generated by an on-chip test module called a test access port (TAP) module.

The lock-up latches 112 and 114 may be included to provide a minimum hold time for write enable register 118 to avoid hold timing violations between flip-flops in the scan chains that are connected to a clock tree (not shown) at different points. Depending on the manufacturing process technology and the flip-flop design, the lock-up latches 112 and 114 may not be necessary.

The LBRAM test scan output signal 142 and the logic test scan output signal 144 are logically identical, but have separate names to facilitate connections by a flow automated standardized test tool according to well-known techniques. The test tool performs test logic generation and insertion and test pattern generation and verification. The failure analysis scan test tool also stitches all scan chains together and routes test connections at the chip level, including connections to a test access ports (TAP) module that controls internal test signals during all test modes. The TAP module is automatically generated according to well-known techniques.

The test patterns may be generated according to well-known techniques so that there is no need for any extra test logic such as built-in self-test logic (BIST) or an external test collar, thereby significantly reducing the die area required for the integrated circuit design. While it may be possible to use test programs to generate test patterns for LBRAM without adding an external test collar, there may be some instances where the LBRAM inputs cannot be controlled. This is most likely to occur when there are several LBRAMs that have to be tested concurrently. Advantageously, the modified latch based RAM 100 described above uses the internal LBRAM flip-flops to ensure that each LBRAM can receive the test patterns, and the test runtime is significantly less than would be the case if no external test collar were used.

During the LBRAM test, the LBRAM address and data inputs are directly controlled by scanning in the test values directly into the read address register 116, the write address register 120, and the input data register 122. The read address register 116, the write address register 120, and the input data register 122 constitute LBRAM scan subchains. The LBRAM scan subchains of all the LBRAMs are concatenated into several scan chains by the failure analysis scan test tool according to well-known techniques.

An important feature of the present invention is that for the LBRAM scan test, the scan chains include only LBRAM scan chains. This feature reduces the length of the scan chains and the corresponding test time required on the automatic test equipment (ATE). ATE time is extremely expensive and may contribute a substantial portion of the cost of integrated circuit production.

Another important feature of the present invention is that the data output of the LBRAMs during the LBRAM scan test may be observed in the LBRAM scan subchain by using the input data register to capture the test data, thereby avoiding the need for an output data register.

Testing of the logic surrounding the LBRAMs may be performed by including the LBRAM scan chains in the logic test scan chains as follows.

FIG. 2 illustrates a schematic 200 of a scan chain with a logic chain external to the modified LBRAM 100 of FIG. 1. Shown in FIG. 2 are an input buffer 202, an input bscan cell 204, LBRAM subchains 206 and 208, a scan test output multiplexer 210, an output bscan cell 212, an output buffer 214, a test access port (TAP) module 216, a logic scan chain 218, and an LBRAM scan mode signal 220.

In FIG. 2, the logic scan chain 218 is tested by including the LBRAM subchains 206 and 208 in the logic scan test. During the logic scan test, the logic scan chain 218 is selected by the scan input multiplexer 102 in the LBRAM subchain 208, and the LBRAM latch arrays 130 are bypassed by the latch array bypass multiplexers 108 in FIG. 1 in response to the LBRAM scan mode signal 220, advantageously ensuring 100 percent fault coverage of the logic scan chain and reducing test time. During the LBRAM scan test, the logic scan chain 218 is bypassed by the scan input multiplexer 102 in the LBRAM subchain 208, and the LBRAM latch arrays 130 are selected by the latch array bypass multiplexer 108 in response to the LBRAM scan mode signal 220, advantageously reducing the testing time of the LBRAM latch arrays 130.

FIG. 3 illustrates a schematic 300 of a scan chain with multiple logic scan chains external to the modified LBRAM 100 of FIG. 1. Shown in FIG. 3 are an input buffer 202, an input bscan cell 204, LBRAM subchains 206 and 208, a scan test output multiplexer 210, an output bscan cell 212, an output buffer 214, a test access port (TAP) module 216, a logic scan chain 218, an LBRAM scan mode signal 220, and logic scan chains 302 and 304.

In FIG. 3, the logic scans chain 302 and 304 are tested by including the LBRAM subchains 206 and 208 in the logic scan test. During the logic scan test, the logic scan chains 302 and 304 are selected by the scan input multiplexers 102 in the LBRAM subchains 206 and 208, and the LBRAM latch arrays 130 are bypassed by the latch array bypass multiplexers 108 in FIG. 1 in response to the LBRAM scan mode signal 220. During the LBRAM scan test, the logic scan chains 302 and 304 are bypassed by the scan input multiplexers 102 in the LBRAM subchains 206 and 208, and the LBRAM latch arrays 130 are selected by the latch array bypass multiplexers 108 in response to the LBRAM scan mode signal 220. Again, there is no loss of test coverage in the external logic scan chains 302 and 304, and the testing time is advantageously reduced as described above.

In FIGS. 2 and 3, the scan chains extend from one external chip pin, the input pin, to another chip pin, the output pin. The input pin connects to the I/O buffer 202 that is followed by the bscan cell 204. The bscan cell 202 is a special cell used to implement boundary scan chains that connect all the I/O cells together. The boundary scan chains bypass all of the internal logic of the integrated circuit die and are used during system testing to test board level connections when the die is attached to a board. From the input bscan cell 202, the scan chains are split into an LBRAM scan chain and a logic scan chain as illustrated in FIGS. 2 and 3. The two chains are recombined by the scan input multiplexer 102 in each LBRAM so that they share the same subchain inside each LBRAM.

The LBRAM scan chain connects directly from the input bscan cell 204 to the first LBRAM, and then from the first LBRAM to the next LBRAM, and so on through all the LBRAMs. The logic scan chains connect the LBRAMS as well as the scan subchains for the surrounding logic on the die. The logic scan chains and the LBRAM scan chains are recombined finally by the scan test output mux 210 that is added automatically by the failure analysis scan test tool. The scan chains are connected to the output bscan cell 212 and the output buffer 214 and finally to the output pin.

In the example of FIG. 2, there is no scan subchain in the logic scan chain between the input pin and the first LBRAM or between the last LBRAM and the output pin. In the example of FIG. 3, scan subchains are connected between the input pin and the first LBRAM and between the last LBRAM and the output pin. In both FIGS. 2 and 3, the test access port (TAP) module 216 generates the LBRAM scan mode signal 220 to the input multiplexers 102, to the latch array bypass multiplexers 108 in the LBRAMs 100, and to the scan test output mux 210 added by the failure analysis scan test tool. The LBRAM scan mode signal 220 ensures that the LBRAM scan chains are selected and that the logic subchains are bypassed during the LBRAM scan test. During the logic scan test, the LBRAM scan mode signal 220 ensures that the logic subchains and the LBRAM scan subchains are selected while the LBRAM latch arrays are bypassed.

An important aspect of the present invention is that instead of testing all the logic functions of the die in one scan test, the scan test is partitioned into a logic scan test and a memory scan test to reduce the total test time required of the automated test equipment (ATE) and to ensure complete fault coverage of both the LBRAMs and the surrounding logic in the integrated circuit die. Alternatively, the scan test may be implemented without separating the LBRAM scan subchains from the logic scan chain in various embodiments of the present invention within the scope of the appended claims, and a separate output data register may be added to each LBRAM instead of reusing the input data register.

During the LBRAM scan test, a test pattern is scanned into the LBRAM input data registers 122 through the LBRAM scan chain. After the test pattern is scanned in, the scan enable signal 146 is removed to prevent shifting along the scan chain, and the scan clock signal 136 is cycled. If the test pattern has asserted the write enable 148, then the data in the input data register 122 is written into the latch array 130 at the address specified in the write address register 120. The latch array bypass multiplexer 108 selects the data from the latch array 130 so that the data is captured by the input data register 122 of the LBRAM. After the data is captured by the input data register 122 of the LBRAM, the scan enable 146 signal is asserted again to continue scanning the test data through the LBRAM scan chain.

During the logic scan test, a test pattern is scanned into the LBRAM read address registers 116, the LBRAM write address registers 120, and the input data registers 122 through the logic scan chain. The latch array bypass multiplexer 108 selects the output of the input data register 122, bypassing the latch array 130, so that the surrounding logic subchains connected to the LBRAM output data buffers 132 are controlled by the values in the input data registers 122. After the test pattern is scanned in, the scan enable signal 146 is removed to prevent shifting along the scan chain. The scan clock signal 136 is cycled to allow the logic states of the surrounding logic connected to the LBRAM inputs to be captured by the LBRAM read address registers 116, the LBRAM write address registers 120, and the input data registers 122. After the data is captured by the LBRAM read address registers 116, the LBRAM write address registers 120, and the input data registers 122, the scan enable signal 136 is asserted again to continue scanning the test data through the logic scan chain. For high speed testing, the launch off shift method may be used without changes to the internal structure of the LBRAM.

FIG. 4 illustrates a timing diagram 400 of a write and read operation for a memory array using the LBRAM of FIG. 1. Shown in FIG. 4 are a clock signal 402, a scan enable signal 404, a write enable register signal 406, an array write enable signal 408, a write address signal 410, a read address signal 412, and a data input signal 414.

During the write operation, a '1' must be shifted into the write enable register 118. On the rising edge of the clock signal 402 in the last shift cycle, the outputs of the read address register 116 are valid, which launches the read operation in this launch off shift scheme. The array write enable signal 408 is gated with the scan enable signal 404 to preserve the contents of the latch array 130 during shifting. Gating the array write enable signal 408 with the scan enable signal 404 ensures that the write enable signal 408 does not go high until the falling edge of the scan enable signal 404, which launches the write operation. The array write enable signal 408 falls at the next falling edge of the clock signal 402 in the capture cycle, which latches the data from the input data register 122 in the latch array, ending the write cycle. On the next rising edge of the clock signal 402 in the capture cycle, the data output from the latch array 130 is captured back into the input data register 122, ending the read operation.

FIG. 5 illustrates a timing diagram 500 of a read operation for a memory array using the LBRAM of FIG. 1. Shown in FIG. 5 are a clock signal 402, a scan enable signal 404, a write address signal 410, a read address signal 412, a data input signal 414, a write enable register signal 502, and an array write enable signal 504.

The read operation is launched from the rising edge of the clock signal 402 in the last shift cycle, and the data is captured on the next rising edge of the clock signal 402.

FIG. 6 illustrates a detailed timing diagram 600 of the clock and scan enable signals of FIGS. 4 and 5 for shifting at a clock speed of 20 MHz. For high speed testing, the edges of the clock during the capture cycle have to be accelerated from the low speed scan clock period to the high speed scan clock period.

FIG. 7 illustrates a detailed timing diagram 700 of an accelerated clock signal for high speed testing according to an embodiment of the present invention. Shown in FIG. 7 are an accelerated clock signal 702 and a scan enable signal 404.

In FIG. 7, the falling edge of the accelerated clock signal 702 in the capture cycle occurs at about one-half the high speed test period after the falling edge of the scan enable signal, and the next rising edge of the accelerated clock signal 702 occurs at about one high speed test period after the previous rising edge. Time zero in FIG. 7 corresponds to the falling edge of the scan enable signal. The rising edge of the clock signal in the last shift cycle occurs about two nanoseconds before the falling edge of the scan enable signal so that the scan enable signal meets the hold time requirements before falling. Two nanoseconds is a reasonable separation between the rising edge of the clock signal and the falling edge of the scan enable signal, because some automated test equipment (ATE) can only generate signal transitions in multiples of one nanosecond.

The falling edge of the clock in the capture cycle occurs at one-half the clock period after the falling edge of scan enable, defining the high speed write time. The rising edge of the clock signal in the capture cycle occurs one clock period after the previous rising edge, defining the high speed read time. The rising edge of the clock signal in the capture cycle occurs at one clock period minus two nanoseconds from the falling edge of the scan enable signal.

In this example, the high speed test period is 10 nanoseconds. The scan enable transitions remain unchanged. The scan enable transitions must meet the hold time requirements for the scan flip-flops, therefore the rising edge of the accelerated clock signal 702 must always be set with the appropriate margin. In FIG. 7, an example is illustrated of the timing setup on the tester for scan operation at 20 MHz and capture operation at 100 MHz.

FIG. 8 illustrates a capture timing diagram 800 for 62.5 MHz according to an embodiment of the present invention. Shown in FIG. 8 are an accelerated clock signal 802 and a scan enable signal 404.

In FIG. 8, the accelerated clock cycle 802 is similar to the accelerated clock cycle 702 FIG. 7 except that the high speed test period is 16 nanoseconds.

FIG. 9 illustrates a capture timing diagram 900 for 125 MHz according to an embodiment of the present invention. Shown in FIG. 9 are an accelerated clock signal 902 and a scan enable signal 404.

In FIG. 9, the accelerated clock cycle 902 is similar to the accelerated clock cycle 702 FIG. 7 except that the high speed test period is eight nanoseconds.

To achieve high speed read and write testing, the timing on the scan enable signal must be fast, similar to that of the clock signal. Accordingly, a separate scan enable signal from that used for the logic scan testing may be applied to a clock tree for driving the LBRAM scan enable inputs 146 in FIG. 1.

FIG. 10 illustrates a schematic diagram for a scan enable signal according to an embodiment of the present invention. Shown in FIG. 10 are a scan enable signal 1002, a scan clock signal 1004, I/O pads 1006, a logic scan enable signal 1008, a scan enable driver 1010, a scan clock driver 1012, scan enable tree buffers 1014, scan clock tree buffers 1016, and LBRAMs 100.

In FIG. 10, the logic scan enable signal 1008 is used to drive the ASIC logic during the logic scan test, while the scan enable driver 1010 drives the scan enable tree buffers 1014 that buffer the scan enable signal 1002 to the LBRAMs 100. The scan clock driver 1012 drives the scan enable tree buffers 1014 that buffer the scan clock signal 1004 to the LBRAMs 100.

The LBRAMs 100 all share the same scan clock signal 1004 and the same scan enable signal 1002, therefore the skew in each of the clock tree networks must be controlled so that there is an identical timing for each of the LBRAMs 100. Specifically, the difference in arrival time between the scan enable signal 1002 and the same scan clock signal 1004 should be the same at each of the LBRAMs 100. One method of controlling skew is to minimize the skew on the scan enable signal 1002 to a reasonable value, for example, 250 picoseconds. However, it may be difficult to maintain this skew across LBRAMs that are distributed widely across the die. Another method of controlling skew is to maintain the same difference in insertion delays between the scan clock and the scan enable signals for all of the LBRAMs 100. For example, if the insertion delay for the scan clock signal 1004 is eight nanoseconds and the insertion delay for the scan enable signal 1002 is 10 nanoseconds at one of the LBRAMs 100, then all of the other LBRAMs 100 should have the same difference in insertion delay. For example, if the insertion delay for the scan clock signal 1004 at one of the LBRAMs 100 is 12 nanoseconds, then the insertion delay for the scan enable signal 1002 should be 14 nanoseconds.

FIG. 11 illustrates a diagram 1100 of insertion delay and skew of the scan clock and the scan enable signals for the schematic of FIG. 10. In FIG. 11, the arrival times of the scan clock and the scan enable signals are different at LBRAMs 1 and N, however, the relative timing between the scan clock and the scan enable signals remains the same at each of the LBRAMs.

In summary, the scan enable signal is generated to meet the following criteria:

(1) the scan enable signal to the LBRAMs is routed separately from that used to test the logic;
(2) the LBRAM scan enable is routed to the LBRAMs in the same manner as the scan clock signal either to maintain the skew of the scan enable and the scan clock signals below, for example, 250 picoseconds or to maintain the difference in insertion delays between the scan enable and the scan clock signals at each of the LBRAMs to the same value within a tolerance of, for example, 250 picoseconds.

There are software tools that are commercially available that can create clock networks in which skew is minimized across the network, for example, CTS from Synopsys. These software tools typically insert clock drivers and repeaters in the design layout to deliver the clock signal throughout the integrated circuit die. The size of the drivers and repeaters is adjusted so that the arrival time at each endpoint of the clock network is the same.

Because the scan enable and the scan clock signals that may have different insertion delays, they must be synchronized by the tester. The ATE operator (Test Engineer) does this, for example, by programming the transition time of the scan enable signal to account for the difference in insertion delays between the LBRAM scan enable and scan clock signals. The Fastscan tool from Mentor Graphics may be used by the ASIC designer to program the transition time of the scan enable, but again the designer must account for the difference in insertion delays.

The timing setup on the tester must take into account various factors of uncertainty for the scan clock and scan enable signals. These factors include the tester skew, loadboard skew, rise and fall time uncertainty, LBRAM scan clock skew, LBRAM scan enable skew, and LBRAM scan clock uncertainty. If the scan enable insertion delay is controlled relative to the scan clock insertion delay, then the LBRAM scan clock skew and the LBRAM scan enable skew may be replaced by the LBRAM scan clock/enable insertion delay uncertainty. If the sum of all these factors is termed as the total uncertainty, then programming the tester for a specific delay between the scan enable and scan clock signals may result in the actual delay at a specific LBRAM being increased or decreased by the total uncertainty. The total uncertainty applies only to the write cycle timing.

The read cycle is affected only by the timing on the LBRAM scan clock, so that only the rise and fall time uncertainty and the LBRAM scan clock uncertainty apply to the read cycle timing setup.

The circuit designer cannot change the tester characteristics, therefore the tester skew and tester ramptime uncertainty are constant once a tester is chosen. However, a loadboard is designed for testing each ASIC. The loadboard should be designed to minimize skew between the scan enable and scan clock signals.

A commonly used tester for ASICs is the Advantest Model T6672, for which the skews and uncertainties are known. An analysis performed on an exemplary design to determine the on-chip delay uncertainties produced the results summarized in FIG. 12.

FIG. 12 illustrates a table 1200 of insertion delay and skew in a timing setup for a scan tester according to an embodiment of the present invention. In the table of FIG. 12, the high speed test was designed to test read and write operations at a clock speed of 100 MHz, which corresponds to a write cycle of 5 nanoseconds and a read cycle of 10 nanoseconds. However, the uncertainty above will result in a write time of as little as 4.325 nanoseconds or as much as 5.675 nanoseconds for any given LBRAM on any specific die. The uncertainty for the read cycle is +/−400 picoseconds, therefore the read cycle may vary between 9.6 nanoseconds and 10.4 nanoseconds. The corresponding read test speeds are 104 MHz and 96 MHz.

FIG. 13 illustrates an example of a march algorithm 1300 used to generate a test pattern for the LBRAM 100 of FIG. 1.

Step 1 of the march algorithm initializes the LBRAM by writing the data words AAAA and 5555 into alternating latch array locations.

Step 2 of the march algorithm checks the stored data.

Step 3 of the march algorithm checks the stored data in reverse address order to fully test the address decoder and writes the data words 0000 and FFFF into alternating latch array locations.

Step 4 of the march algorithm checks for a stuck "1" on the write enable.

Step 5 of the march algorithm checks for high speed read and write to the same address.

The algorithm of FIG. 13 provides 100 percent stuck at fault coverage and 100 percent coverage of bridging faults between adjacent bits, including all eight neighbors in the horizontal, vertical, and diagonal directions. When the patterns are tested at high speed, there is a 100 percent coverage of transition delay faults for the latch array 130 in FIG. 1, however, the transition delay fault coverage for the decode logic is somewhat less than 100 percent. The total number of test patterns is 5*r+3, where r is the number of words in the latch array 130.

FIG. 14 illustrates a flow chart 1400 of a method of high speed testing of latch based random access memory according to an embodiment of the present invention.

Step 1402 is the entry point of the flow chart 1400.

In step 1404, the modified LBRAM memory blocks are generated in the integrated circuit design. This step includes the modifications to the LBRAM 100 illustrated in FIG. 1 and described above.

In step 1406, the scan chains are stitched together as illustrated in FIGS. 2 and 3, and connections are made from the scan chain to the top level of the design according to well known techniques.

In step 1408, a test access ports (TAP) controller is inserted in the integrated circuit design and coupled to the scan chains according to well-known techniques as illustrated in FIGS. 2 and 3.

In step 1410, a separate scan enable signal is generated for testing the LBRAM 100 that minimizes skew at each LBRAM 100 as illustrated in FIG. 10.

In step 1412, a modified scan clock signal is generated for testing the LBRAM 100. The scan clock signal has a falling edge that occurs about one-half the high speed scan clock period from the falling edge of the scan enable signal and has a rising edge that occurs about one high speed scan clock period from the previous rising edge as illustrated in FIG. 7. The difference in insertion delay between the scan enable signal and the scan clock signal is preferably held constant at each LBRAM 100. The transition time of the scan enable signal on the tester should be adjusted to account for the difference in insertion delays between the scan clock and the LBRAM scan enable signals, and the skew between the scan enable signal and the scan clock signal is preferably minimized on the loadboard to avoid inducing read and write errors during scan test.

In step 1414, a test pattern is generated for testing stuck-at faults and transition delay faults, for example, as illustrated in FIG. 13.

In step 1416, the LBRAM 100 is tested with the test pattern generated in step 1414 using the separate scan enable generated in step 1410 and the modified scan clock generated in step 1412.

Step 1418 is the exit point of the flow chart 1400.

The test program described above may be transferred to the automated test equipment according to well known techniques and used to test fabricated dies, and a failure analysis may be performed to determine which latches are failing in the LBRAM latch arrays. The failure analysis information may then be used to correct problems in manufacturing and to decrease the failure rate.

Other important aspects of the present invention include the use of the internal registers in the LBRAM in the scan chain instead of creating additional registers in an external collar, and the reuse of the input data register of the LBRAM to capture data output from the LBRAM in the LBRAM scan chain.

Compared to built-in self-test (BIST) schemes, the modified LBRAM of present invention provides a reduction in total memory area of an integrated circuit die, typically 40 percent. In an average design, the memory area uses about 23 percent to 32 percent of the total die area, therefore a 40 percent reduction in memory area will result in an average reduction in total die area of about 13 percent and a corresponding decrease in silicon production costs.

FIG. 15 illustrates a flow chart 1500 summarizing the method of FIG. 14.

Step 1502 is the entry point of the flow chart 600.

In step 1504, a scan enable signal is generated for testing LBRAM in an integrated circuit design. The integrated circuit design includes scan chains for testing LBRAM 100 that are implemented in existing registers inside the LBRAM 100. This step includes the modifications to the LBRAM 100 illustrated in FIG. 1 and described above. The scan enable signal substantially minimizes skew at each LBRAM as illustrated in FIG. 10. The term "substantially" is used to mean that the skew is minimized to a level that will not induce read or write errors during high speed scan testing.

In step 1506, a scan clock signal is generated for testing the LBRAM having a low speed scan period for shifting and a high speed scan period for capture. In the capture cycle, the scan clock signal has a falling edge that occurs about one-half the high speed scan clock period from the falling edge of the scan enable signal and has a rising edge that occurs about one full high speed scan clock period from the previous rising edge of the last shift cycle.

Step 1508 is the exit point of the flow chart 1500.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations may be made thereto by those skilled in the art without departing from the scope of the invention set forth in the following claims.

What is claimed is:

1. A method comprising steps of:
generating a scan enable signal for testing latch based random access memories; and
generating a scan clock signal for testing the latch based random access memories, the scan clock signal having a first period for a shift cycle and a second period shorter than the first period for a high speed memory test of the latch based random access memories, the scan clock signal having a falling edge that follows an immediately preceding falling edge of the scan enable signal by at least one-half of the second period for testing a high speed write operation and the scan clock signal having a rising edge that follows an immediately preceding rising edge of the scan clock signal by the second period for testing a high speed read operation so that the read operation is launched from the preceding rising edge of the scan clock signal before the falling edge of the scan enable signal.

2. The method of claim 1 further comprising a step of minimizing skew of the scan enable signal relative to the scan clock signal at each one of the latch based random access memories.

3. The method of claim 2 further comprising a step of providing a clock tree to minimize skew of the scan enable signal relative to the scan clock signal at each one of the latch based random access memories.

4. The method of claim 1 wherein an insertion delay of the scan enable signal differs from that of the scan clock signal by less than 250 picoseconds at each one of the latch based random access memories.

5. The method of claim 1 wherein the first scan clock period corresponds to a frequency of 20 MHz.

6. The method of claim 1 wherein the second scan clock period corresponds to a frequency of about 62 MHz.

7. The method of claim 1 wherein the second scan clock period corresponds to a frequency of about 100 MHz.

8. The method of claim 1 wherein the second scan clock period corresponds to a frequency of about 125 MHz.

9. An apparatus comprising:
   scan chains for testing latch based random access memories wherein the scan chains are implemented in existing registers inside the latch based random access memories;
   a scan enable signal generator for generating a scan enable signal to test the latch based random access memories; and
   a scan clock signal generator for generating a scan clock signal to test the latch based random access memories, the scan clock signal having a first period for a shift cycle and a second period shorter than the first period for a high speed memory test of the latch based random access memories, the scan clock signal having a falling edge that follows an immediately preceding falling edge of the scan enable signal by at least one-half of the second period for testing a high speed write operation and the scan clock signal having a rising edge that follows an immediately preceding rising edge of the scan clock signal by the second period for testing a high speed read operation so that the read operation is launched from the preceding rising edge of the scan clock signal before the falling edge of the scan enable signal.

10. The apparatus of claim 9 wherein the scan enable signal has a minimum skew relative to the scan clock signal at each one of the latch based random access memories.

11. The apparatus of claim 10 wherein the scan enable signal generator comprises a clock tree.

12. The apparatus of claim 9 wherein an insertion delay of the scan enable signal differs from that of the scan clock signal by less than 250 picoseconds at each one of the latch based random access memories.

13. The apparatus of claim 9 wherein the first scan clock period corresponds to a frequency of about 20 MHz.

14. The apparatus of claim 9 wherein the second scan clock period corresponds to a frequency of about 62 MHz.

15. The apparatus of claim 9 wherein the second scan clock period corresponds to a frequency of about 100 MHz.

16. The apparatus of claim 9 wherein the second scan clock period corresponds to a frequency of about 125 MHz.

* * * * *